United States Patent
In et al.

(10) Patent No.: US 9,305,989 B2
(45) Date of Patent: Apr. 5, 2016

(54) ORGANIC LIGHT-EMITTING DISPLAY AND METHOD OF MANUFACTURING THE SAME

(71) Applicant: SAMSUNG DISPLAY CO., LTD., Yongin, Gyeonggi-Do (KR)

(72) Inventors: Hai Jung In, Songpa-gu (KR); Yong Sung Park, Songpa-gu (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/332,251

(22) Filed: Jul. 15, 2014

(65) Prior Publication Data
US 2015/0249119 A1    Sep. 3, 2015

(30) Foreign Application Priority Data
Feb. 28, 2014   (KR) .......................... 10-2014-0024307

(51) Int. Cl.
| | | |
|---|---|---|
| *H01L 29/08* | (2006.01) | |
| *H01L 21/00* | (2006.01) | |
| *H01L 27/32* | (2006.01) | |
| *H01L 51/52* | (2006.01) | |

(52) U.S. Cl.
CPC ........ *H01L 27/3269* (2013.01); *H01L 27/3246* (2013.01); *H01L 27/3258* (2013.01); *H01L 51/5209* (2013.01); *H01L 51/5218* (2013.01)

(58) Field of Classification Search
CPC ............ H01L 27/3246; H01L 27/3258; H01L 27/3269; H01L 51/5209; H01L 51/5218
USPC ................... 257/40, 72, 82, 88, 292, E33.076; 438/22–24, 28–29, 34–39
See application file for complete search history.

(56) References Cited

U.S. PATENT DOCUMENTS

2013/0017648 A1* 1/2013 Yim ........................ H01L 29/45
                                                                     438/104

FOREIGN PATENT DOCUMENTS

| KR | 10-2007-0020431 A | 2/2007 |
|---|---|---|
| KR | 10-2010-0047456 A | 5/2010 |
| KR | 10-2012-0017661 A | 2/2012 |
| KR | 10-2012-0119097 A | 10/2012 |

* cited by examiner

*Primary Examiner* — H Tsai
(74) *Attorney, Agent, or Firm* — Lewis Roca Rothgerber Christie LLP

(57) ABSTRACT

An organic light-emitting display and a method of manufacturing an organic light-emitting display are described. According to an aspect, the organic light-emitting display includes a substrate, a photodiode on the substrate, a planarization layer covering the photodiode, a first electrode on the planarization layer, a pixel defining layer at least partially exposing the first electrode, an organic layer covering the first electrode which is exposed by the pixel defining layer and a second electrode covering the pixel defining layer and the organic layer.

17 Claims, 19 Drawing Sheets

ORGANIC LIGHT-EMITTING DISPLAY AND METHOD OF MANUFACTURING THE SAME

CROSS-REFERENCE TO RELATED APPLICATION

This application claims priority to and the benefit of Korean Patent Application No. 10-2014-0024307 filed on Feb. 28, 2014 in the Korean Intellectual Property Office, the disclosure of which is incorporated herein by reference in its entirety.

BACKGROUND

1. Field

The present invention relates to an organic light-emitting display (OLED) and a method of manufacturing the same.

2. Description of the Related Art

Various flat panel displays (FPDs) which are lighter in weight and smaller in volume than cathode ray tubes (CRTs) are being developed. In particular, electroluminescent displays using an organic compound as a light-emitting material are drawing a lot of attention as next-generation displays due to their excellent luminance and color purity. In addition, since organic electroluminescent displays are thin and light and can be driven with low power, they are expected to be applicable to, e.g., portable displays. To maintain constant visibility, a portable display maintains light generated from an organic layer constant. To this end, the portable display includes an optical sensor capable of sensing light generated from the organic layer. Using the optical sensor, the portable display measures light generated from the organic layer and adjusts the intensity of light generated from the organic layer based on the measured light. An organic light-emitting diode may include an anode, an organic layer and a cathode, and the sensitivity of the optical sensor is dependent on optical characteristics of each of the above elements. In particular, interference of external light makes it difficult for the optical sensor to accurately measure light generated from the organic light-emitting diode.

SUMMARY

Aspects of the present invention provide an organic light-emitting display (OLED) which can suppress the interference of external light in order to enhance the sensing capability of an optical sensor.

Aspects of the present invention also provide a method of manufacturing an OLED which can suppress the interference of external light in order to enhance the sensing capability of an optical sensor.

Aspects of the present invention also provide an OLED in which an increased amount of light generated from an organic layer reaches an optical sensor.

Aspects of the present invention also provide a method of manufacturing an OLED in which an increased amount of light generated from an organic layer reaches an optical sensor.

Aspects of the present invention are not restricted to those set forth herein. The above and other aspects of the present invention will become more apparent to one of ordinary skill in the art to which the present invention pertains by referencing the detailed description of the present invention given below.

According to an aspect of the present invention, there is provided an organic light-emitting display including a substrate; a photodiode on the substrate; a planarization layer covering the photodiode; a first electrode on the planarization layer; a pixel defining layer at least partially exposing the first electrode; an organic layer covering the first electrode exposed by the pixel defining layer; and a second electrode covering the pixel defining layer and the organic layer, wherein the first electrode includes a first region overlapping the photodiode and a second region which is a remaining region of the first electrode excluding the first region, and wherein a thickness of the first region of the first electrode is different from a thickness of the second region of the first electrode.

The first region may be thinner than the second region.

The first electrode may include a reflective electrode.

The first electrode may include silver (Ag).

The organic light-emitting display may further include: a gate insulating layer covering the photodiode; and an interlayer insulating film covering the gate insulating layer, wherein the photodiode includes a portion exposed by the gate insulating layer and the interlayer insulating film, and wherein the first region overlaps the exposed portion.

A width of the first region may be equal to or greater than a width of the exposed portion.

The first electrode may include a first layer first electrode on the planarization layer and a second layer first electrode on the first layer first electrode, wherein the first layer first electrode has a uniform thickness, and the first region of the second layer first electrode is thinner than the second region of the second layer first electrode.

The first electrode includes a first layer first electrode on the planarization layer, a second layer first electrode on the first layer first electrode, and a third layer first electrode on the second layer first electrode.

Each of the first layer first electrode and the third layer first electrode may have a uniform thickness, and the first region of the second layer first electrode may be thinner than the second region of the second layer first electrode.

Each of the first layer first electrode and the third layer first electrode may include a transparent electrode, and the second layer first electrode may include a reflective electrode.

The second layer first electrode may include Ag.

According to another aspect of the present invention, a method of manufacturing an organic light-emitting display is described, including: placing a photodiode on a substrate; forming a planarization layer to cover the photodiode; placing a first electrode on the planarization layer; forming a pixel defining layer and at least partially exposing the first electrode; placing an organic layer on the first electrode exposed by the pixel defining layer; and forming a second electrode to cover the pixel defining layer and the organic layer, wherein the placing the first electrode on the planarization layer comprises forming a first region of the first electrode overlapping the photodiode, and forming a second region of the first electrode having a different thickness than the first region, the second region being a remaining region of the first electrode excluding the first region.

The forming the first region of the first electrode may include forming the first region to be thinner than the second region.

The placing the first electrode on the planarization layer may include: forming a first layer first electrode having a uniform thickness on the planarization layer; forming a second layer first electrode on the first layer first electrode; and forming a third layer first electrode on the second layer first electrode.

Each of the first layer first electrode and the third layer first electrode may include a transparent electrode, and the second layer first electrode may include a reflective electrode.

The second layer first electrode may include Ag.

Each of the first layer first electrode and the third layer first electrode may have a uniform thickness, and the first region of the second layer first electrode may be thinner than the second region of the second layer first electrode.

BRIEF DESCRIPTION OF THE DRAWINGS

The above and other aspects and features of the present invention will become more apparent by describing in detail example embodiments thereof with reference to the attached drawings, in which.

DETAILED DESCRIPTION

Figure 1:
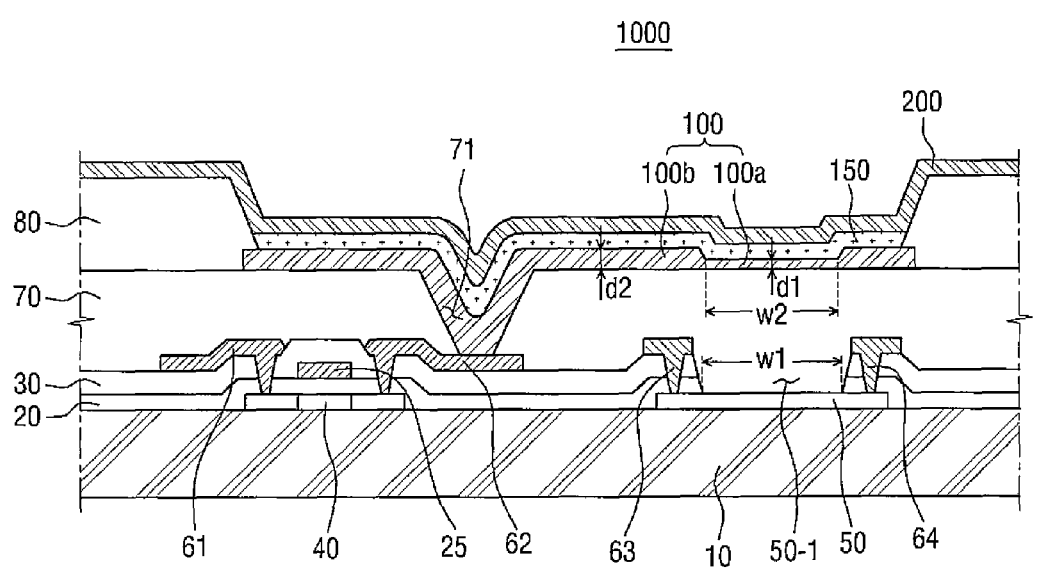
FIG. 1 is a cross-sectional view of an organic light-emitting display (OLED) according to an embodiment of the present invention.

The aspects and features of the present invention and methods for achieving the aspects and features will be apparent by referring to the embodiments described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art to have a comprehensive understanding of the invention, and the embodiments of present invention are defined within the scope of the appended claims.

The term "on" that is used to designate that an element is on another element or located on a different layer or layers includes both a case where an element is located directly on another element or a layer and a case where an element is located on another element via another layer or another element. Throughout the entire description, same drawing reference numerals are used for same elements across various figures.

Although the terms "first, second, and so forth" are used to describe diverse constituent elements, such constituent elements are not limited by the terms. The terms are used to distinguish one constituent element from other constituent elements. Accordingly, in the following description, a first constituent element may instead be referred to as a second constituent element.

Hereinafter, embodiments of the present invention will be described with reference to the attached drawings.

Figure 2:
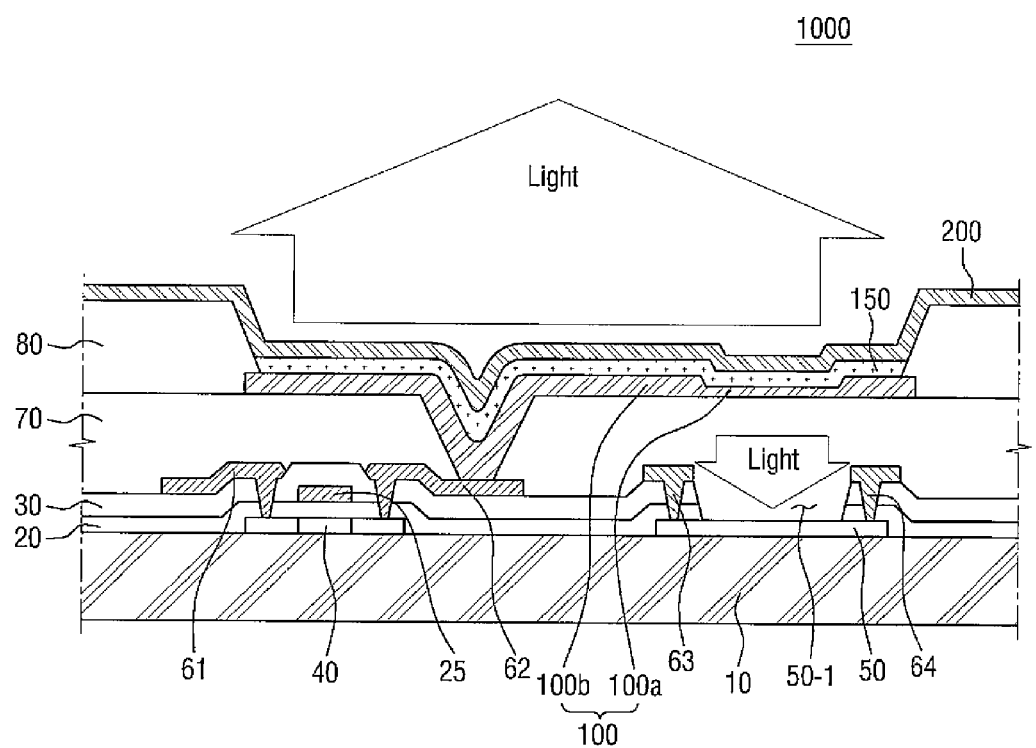
FIG. 2 is a cross-sectional view of the OLED of FIG. 1.

FIG. 1 is a cross-sectional view of an organic light-emitting display (OLED) 1000 according to an embodiment of the present invention. FIG. 2 is a cross-sectional view of the OLED 1000 of FIG. 1.

Referring to FIGS. 1 and 2, the OLED 1000 according to the current embodiment includes a substrate 10, a photodiode 50 which is on the substrate 10, an organic film which covers the photodiode 50, a first electrode 100 which is on the organic film, a pixel defining layer 80 which at least partially exposes the first electrode 100, an organic layer 150 which covers the first electrode 100 exposed by the pixel defining layer 80, and a second electrode 200 which covers the pixel defining layer 80 and the organic layer 150. The first electrode 100 includes a first region 100a which overlaps the photodiode 50 and a second region 100b which is the remaining region excluding the first region 100a. In some embodiments, the first region 100a and the second region 100b of the first electrode 100 have different thicknesses.

The substrate 10 may be a plate-shaped member and may support other elements which will be described later. In some embodiments, the substrate 10 may be an insulating substrate and may be formed of a polymer material containing glass or plastic. In an example embodiment, the substrate 10 may be formed of polyimide (PI). However, the material of the substrate 10 is not limited to polyimide.

The substrate 10 may be a rigid substrate. However, the substrate 10 is not limited to the rigid substrate and may also be a ductile or a flexible substrate. That is, the term "substrate" used herein can be understood to encompass a bendable, foldable, and rollable flexible substrate.

As shown in FIG. 1, the substrate 10 may have a single layer structure. However, the structure of the substrate 10 is not limited to the single layer structure.

That is, in another example embodiment, the substrate 10 may have a stacked structure of two or more layers. In other words, the substrate 10 may include a base layer and a protective layer on the base layer.

The base layer may be formed of an insulating material. In an example embodiment, the base layer may be formed of polyimide. However, the material of the base layer is not limited to polyimide. The protective layer may be on the base layer. The protective layer may be formed of an organic material or an inorganic material. For example, the protective layer may include one or more materials selected from polyethylene terephthalate (PET) and polyethylene naphthalate (PEN). However, the material of the protective layer is not limited to the above examples.

A buffer layer may be on the substrate 10. The buffer layer may prevent penetration of impurity elements from the substrate 10. In an example embodiment, the buffer layer may be formed of one or more materials selected from the group consisting of silicon oxide (SiOx) and silicon nitride (SiNx). However, the material of the buffer layer is not limited to the above examples. The buffer layer may have a single layer structure or a stacked structure of two or more layers. In an example embodiment in which the buffer layer includes of two layers, the two layers may be formed of different materials. For example, a first layer may be formed of silicon oxide, and a second layer may be formed of silicon nitride. However, the structure of the buffer layer is not limited to the above example. In another example embodiment, the buffer layer can be omitted. For example, the buffer layer is omitted in the embodiments shown in FIGS. 1 and 2.

A semiconductor layer 40 may be formed on the substrate 10. The semiconductor layer 40 may be formed of amorphous silicon or polycrystalline silicon. In an example embodiment, the semiconductor layer 40 may be formed by coating, patterning, and then crystallizing amorphous silicon. However, a method of forming the semiconductor layer 40 is not limited to the above example. In the present specification, the term "semiconductor layer" can be understood as an oxide semiconductor layer.

The photodiode 50 may be on the substrate 10. The photodiode 50 may be separated from the semiconductor layer 40 by a predetermined (or a set) distance. In addition, the photodiode 50 may be at the same level as the semiconductor layer 40.

That is, the photodiode 50 and the semiconductor layer 40 may be made of the same material and formed concurrently, (e.g., substantially simultaneously). However, this is merely an example, and the material and method used to form the photodiode 50 are not limited to this example. The photodiode 50 may serve as an optical sensor capable of sensing external light or light irradiated from an organic light-emitting layer which will be described later.

A gate insulating layer 20 may be formed on the semiconductor layer 40 and the photodiode 50. The gate insulating layer 20 may include silicon nitride or silicon oxide, but the material of the gate insulating layer 20 is not limited to the above examples. The gate insulating layer 20 may have a single layer structure. However, the structure of the gate insulating layer 20 is not limited to the single layer structure. The gate insulating layer 20 may also have a multilayer structure which includes two or more insulating layers with different physical properties.

In addition, the gate insulating layer 20 may expose a portion of the semiconductor layer 40 and at least a portion of the photodiode 50.

A gate wiring including a gate line, a gate electrode 25 and a gate pad may be on the gate insulating layer 20. The gate wiring may be formed of one or more materials selected from the group consisting of aluminum (AD-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chrome (Cr), titanium (Ti), and tantalum (Ta). However, the material of the gate wiring is not limited to the above examples, and any transparent or semi-transparent material having conductivity can be used to form the gate wiring.

An interlayer insulating film 30 may be on the gate wiring to cover the gate wiring. The interlayer insulating film 30 may be an inorganic layer formed of an inorganic material. In an example embodiment, the interlayer insulating film 30 may include silicon nitride or silicon oxide, but the material of the interlayer insulating film 30 is not limited to the above examples. The interlayer insulating film 30 may have a single layer structure. However, the structure of the interlayer insulating film 30 is not limited to the single layer structure. The interlayer insulating film 30 may also have a multilayer structure which includes two or more insulating layers with different physical properties.

Like the gate insulating layer 20, the interlayer insulating film 30 may expose at least a portion of the photodiode 50. For ease of description, a portion of the photodiode 50 which is exposed by the interlayer insulating film 30 and the gate insulating layer 20 will be referred to as an exposed portion 50-1. That is, the photodiode 50 may include the exposed portion 50-1 exposed by the interlayer insulating film 30 and/or the gate insulating layer 20.

A data wiring including a source electrode 61, a drain electrode 62 and a data line may be on the interlayer insulating film 30. The data wiring may be formed of molybdenum, chrome, refractory metal such as tantalum and titanium, or an alloy of these materials. However, the material of the data wiring is not limited to the above examples, and any transparent or semi-transparent conductive material can be used to form the data wiring.

A first contact 63 and a second contact 64 may be on the interlayer insulating film 30. The first contact 63 and the second contact 64 may be electrically coupled to the photodiode 50. In an example embodiment, the first contact 63 and the second contact 64 may penetrate through one or more of the interlayer insulating films 30 and the gate insulating layer 20, to electrically couple the photodiode 50. In another example embodiment, the first contact 63 and the second contact 64 may be adjacent both sides of the exposed portion 50-1 of the photodiode 50. That is, the first contact 63 may be adjacent a side of the exposed portion 50-1, and the second contact 64 may be adjacent the other side of the exposed portion 50-1.

The first contact 63 and the second contact 64 may be electrically coupled to a sensing line or a device that drives the photodiode 50. In another example embodiment, the first contact 63 may be electrically coupled to a second thin-film transistor (TFT) which delivers a current generated by the photodiode 50 to the sensing line. This will be described later.

The source electrode 61 may be a portion of the data line and may lie in the same plane with the data line. The drain electrode 62 may extend parallel to the source electrode 61. In this case, the drain electrode 62 may be parallel to the portion of the data line.

The gate electrode 25, the source electrode 61 and the drain electrode 62 form one first TFT, together with the semiconductor layer 40. A channel of the first TFT may be formed in the semiconductor layer 40 between the source electrode 61 and the drain electrode 62. The first TFT may serve as a switching device in the OLED.

The planarization layer 70 may be on the data wiring, the first contact 63, the second contact 64 and the exposed portion 50-1 to cover the data wiring, the first contact 63, the second contact 64, and the exposed portion 50-1. The planarization layer 70 may be relatively thicker than the interlayer insulating film 30. Due to this difference in the thicknesses of the planarization layer 70 and the interlayer insulating film 30, a top surface of the planarization layer 70 may be relatively flatter than a bottom surface thereof which contacts the interlayer insulating film 30 and the source and drain electrodes 61 and 62. To reduce steps formed on the substrate 10, the planarization layer 70 may include one or more materials selected from the group consisting of, e.g., acrylic, benzocyclicbutene (BCB), and polyimide. However, the material of the planarization layer 70 is not limited to the above examples. In addition, the planarization layer 70 may be formed of a photosensitive material.

A first via hole 71 which at least partially exposes the drain electrode 62 may be formed in the planarization layer 70. The first via hole 71 may penetrate through the planarization layer 70 and partially expose a top surface of the drain electrode 62.

The first electrode 100 may be on the planarization layer 70 and an exposed portion of the drain electrode 62. That is, the first electrode 100 may cover the planarization layer 70, sidewalls of the first via hole 71, and the top surface of the drain electrode 62. Accordingly, the first electrode 100 and the drain electrode 62 may be electrically coupled to each other. In an example embodiment, the first electrode 100 may be, but is not limited to, an anode. The first electrode 100 may be formed of indium tin oxide (ITO) or indium zinc oxide (IZO). However, the material of the first electrode 100 is not limited to the above examples. The pixel defining layer 80, the organic layer 150, and the second electrode 200 may be on the first electrode 100. These elements will be described in greater detail later.

The first electrode 100 may include the first region 100a and the second region 100b having different thicknesses. The first region 100*a* may overlap the photodiode 50 or the exposed portion 50-1 of the photodiode 50. A width w2 of the first region 100*a* may be substantially equal to or greater than a width w1 of the exposed portion 50-1.

That is, in an example embodiment, the exposed portion 50-1 may be completely overlapped by the first region 100*a*.

As described above, the first region 100*a* and the second region 100*b* may have different thicknesses. Specifically, a thickness d1 of the first region 100*a* may be relatively smaller than a thickness d2 of the second region 100*b*.

The pixel defining layer 80 may be on the first electrode 100. The pixel defining layer 80 may at least partially expose the first electrode 100.

In an example embodiment, the OLED according to embodiments of the present invention may be a top-emission OLED, and the first electrode 100 may be a reflective electrode. The first electrode 100 formed as a reflective electrode may suppress external light from penetrating through the first electrode 100 to reach the photodiode 50. Therefore, a process of sensing the intensity of light generated from the organic layer 150 and adjusting the intensity of light generated from the organic layer 150 by feeding the sensed intensity back can be performed more delicately. That is, the first electrode 100 formed as a reflective electrode can suppress the interference of external light. In addition, the light generated from the organic layer 150 may be smoothly irradiated to the photodiode 50 when the first electrode 100 includes the first region 100*a* having a relatively small thickness. Thus, the intensity of light generated from the display can be adjusted based on the light irradiated to the photodiode 50. The first electrode 100 formed as a reflective electrode may contain silver (Ag). However, this is merely an example, and the material of the first electrode 100 is not limited to this example.

The pixel defining layer 80 may be formed of one or more organic materials selected from benzocyclobutene (BCB), polyimide (PI), polyamide (PA), acrylic resin, and phenolic resin. Alternatively, the pixel defining layer 80 may be formed of an inorganic material such as silicon nitride. The pixel defining layer 80 may also be formed of a photosensitizer containing black pigments. In this case, the pixel defining layer 80 may serve as a light-blocking member.

The organic layer 150 may be on the first electrode 80 exposed by the pixel defining layer 80. The organic layer 150 may include organic material layers included in an OLED, such as, an organic light-emitting layer (EML), a hole injection layer (HIL), a hole transport layer (HTL), an electron injection layer (EIL), and an electron transport layer (ETL). The organic layer 150 may have a single layer structure including one of the organic material layers or a multilayer structure including two or more of the organic material layers.

The second electrode 200 may be formed on the organic layer 150. The second electrode 200 may cover the pixel defining layer 80 and the organic layer 150. In an example embodiment, the second electrode 200 may be, but is not limited to, a whole-surface electrode which covers the pixel defining layer 80 and the organic layer 150. In an example embodiment, the second electrode 200 may be a cathode.

The second electrode 200 may be formed of indium tin oxide or indium zinc oxide, but the material of the second electrode 200 is not limited to the above examples.

Although not shown in the drawings, an encapsulation member or an encapsulation layer may be on the second electrode 200. The encapsulation member or layer may be substantially similar to those known in the art, and thus will not be described in detail in order to not obscure the scope of the present invention.

The effect of the OLED according to the current embodiment will now be described with reference to FIG. 2.

As described above, the OLED according to embodiments of the present invention may be a top-emission OLED. In the OLED according to the embodiments of the present invention, the photodiode 50 may be used to sense light generated from the organic layer 150. That is, the photodiode 50 may sense the light generated from the organic layer 150 and adjust the intensity of light generated from the organic layer 150 based on the sensing result (e.g., the amount of light that is sensed). Here, the sensing sensitivity of the photodiode 50 can be reduced by the interference of external light, and the reduced sensing sensitivity can make it difficult to adjust the intensity of light generated from the OLED. Thus, the first electrode 100 includes the first region 100*a* having a relatively small thickness such that the light generated from the organic layer 150 can be irradiated more intensely toward the photodiode 50. That is, the sensing sensitivity of the photodiode 50 can be improved by more intense light. In addition, the first electrode 100 may be formed as a reflective electrode to prevent external light from penetrating through the first electrode 100 to reach the photodiode 50. Accordingly, the interference of the external light can be suppressed, which, in turn, improves the sensing sensitivity of the photodiode 50.

Hereinafter, other embodiments of the present invention will be described. In the following embodiments, elements identical to those described above are indicated by like reference numerals, and a redundant description thereof will be omitted or given briefly.

Figure 3:
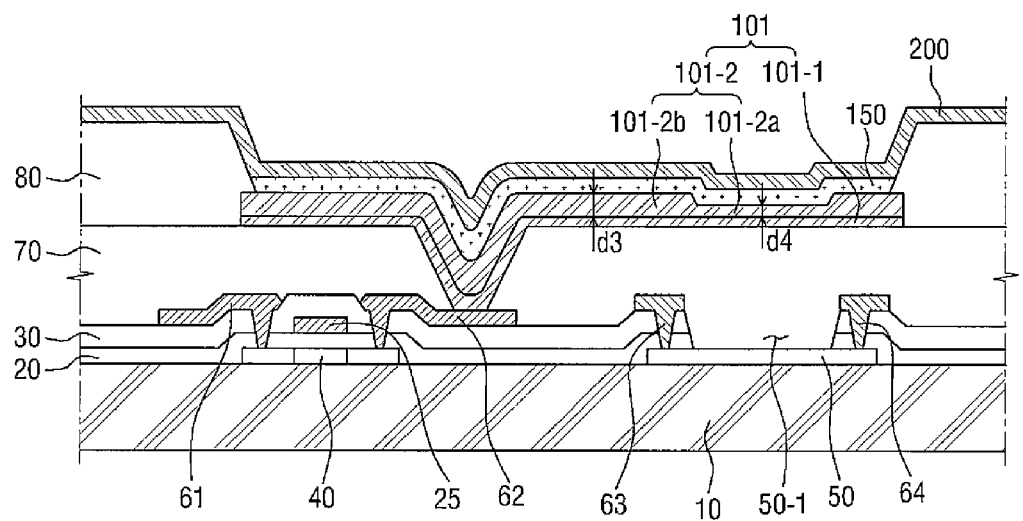
FIG. 3 is a cross-sectional view of an OLED according to another embodiment of the present invention.

FIG. 3 is a cross-sectional view of an OLED according to another embodiment of the present invention.

Referring to FIG. 3, the OLED according to the current embodiment is different from the OLED according to the embodiment of FIG. 1 in that a first electrode 101 has a stacked structure.

The first electrode 101 may have a stacked structure of one or more layers. In the example embodiment of FIG. 3, the first electrode 101 has a stacked structure of two layers. For ease of description, a first electrode 101 on a planarization layer 70 will be referred to as a first layer first electrode 101-1 and a first electrode 101 on the first layer first electrode 101-1 will be referred to as a second layer first electrode 101-2. That is, the first electrode 101 includes the first layer first electrode 101-1 and the second layer first electrode 101-2. In an example embodiment, the first layer first electrode 101-1 and the second layer first electrode 101-2 may be formed of the same material or different materials.

In an example embodiment, the first layer first electrode 101-1 may have a uniform thickness (i.e., same thickness along the entire first layer first electrode 101-1). In addition, the second layer first electrode 101-2 may include a first region 101-2*a* which overlaps a photodiode 50 and a second region 101-2*b* which is the remaining region excluding the first region 101-2*a* (e.g., the region of the second layer first electrode 101-2 that is not the first region 101-2*a*). That is, a thickness d4 of the first region 101-2*a* of the second layer first electrode 101-2 may be relatively smaller than a thickness d3 of the second region 101-2*b*.

In an example embodiment, any one or more of the first layer first electrode 101-1 and the second layer first electrode 101-2 may be a reflective electrode.

According to the embodiment shown in FIG. 3, the first layer first electrode 101-1 has a uniform thickness, and the second layer first electrode 101-2 has different thicknesses, but the present invention is not limited thereto. That is, in another example embodiment, the second layer first electrode 101-2 may have a uniform thickness, and the first layer first electrode 101-1 may include a first region which overlaps the photodiode 50 and has a relatively small thickness and a second region which has a relatively large thickness.

Figure 4:
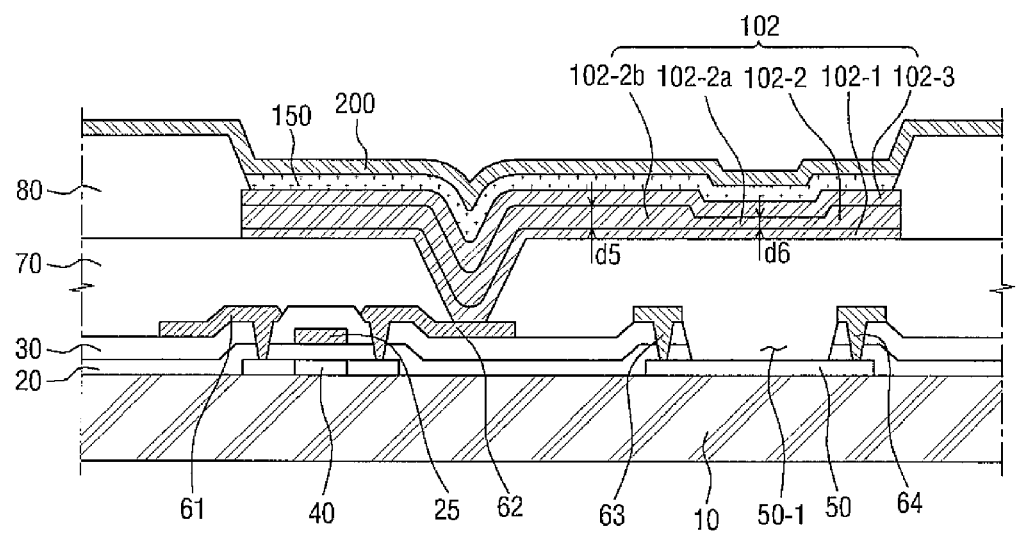
FIG. 4 is a cross-sectional view of an OLED according to another embodiment of the present invention.

FIG. 4 is a cross-sectional view of an OLED according to another embodiment of the present invention.

Referring to FIG. 4, the OLED according to the current embodiment is different from the OLED according to the embodiment of FIG. 1 in that a first electrode 102 has three layers.

In an example embodiment, the first electrode 102 may have of three layers.

For ease of description, a first electrode on a planarization layer 70 will be referred to as a first layer first electrode 102-1, a first electrode on the first layer first electrode 102-1 will be referred to as a second layer first electrode 102-2, and a first electrode on the second layer first electrode 102-2 will be referred to as a third layer first electrode 102-3.

In an example embodiment, each of the first layer first electrode 102-1 and the third layer first electrode 102-3 may have a uniform thickness.

The second layer first electrode 102-2 may be interposed between the first layer first electrode 102-1 and the third layer first electrode 102-3. The second layer first electrode 102-2 may include a first region 102-2a which overlaps a photodiode 50 and a second region 102-2b which is the remaining region excluding the first region 102-2a. A thickness d6 of the first region 102-2a of the second layer first electrode 102-2 may be relatively smaller than a thickness d5 of the second region 102-2b.

In an example embodiment, any one or more of the first layer first electrode 102-1, the second layer first electrode 102-2, and the third layer first electrode 102-3 may be a reflective electrode.

Figure 5:
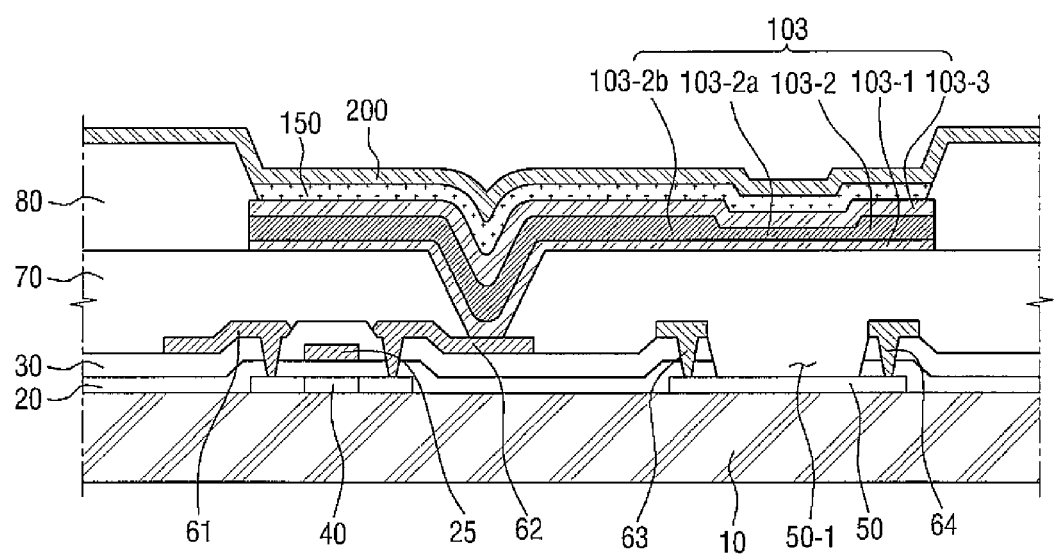
FIG. 5 is a cross-sectional view of an OLED according to another embodiment of the present invention.

FIG. 5 is a cross-sectional view of an OLED according to another embodiment of the present invention. Referring to FIG. 5, in the OLED according to the current embodiment, a first electrode 103 may include a first layer first electrode 103-1, a second layer first electrode 103-2, and a third layer first electrode 103-3.

In an example embodiment, each of the first layer first electrode 103-1 and the first layer third electrode 103-3 may be a transparent electrode, and the first layer second electrode 103-2 may be a reflective electrode. In some embodiments, each of the first layer first electrode 103-1 and the third layer first electrode 103-3 may be formed of ITO, and the second layer first electrode 130-2 may be formed of Ag.

As described above with reference to FIG. 4, the first layer second electrode 103-2 may include a first region 103-2a which overlaps a photodiode 50 and a second region 103-2b which is the remaining region excluding the first region 103-2a. In addition, the first region 103-2a of the second layer first electrode 103-2 may be relatively thinner than the second region 103-2b.

Figure 6:
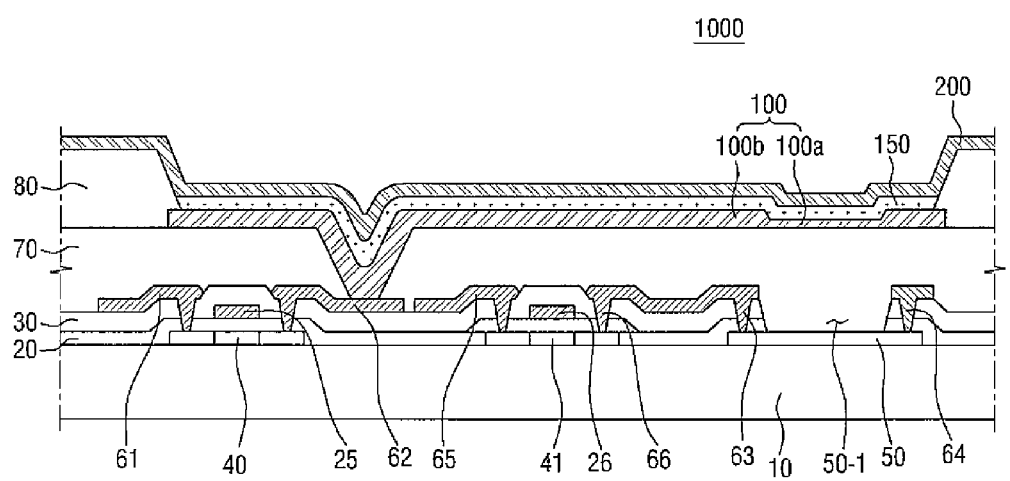
FIG. 6 is a cross-sectional view of an OLED according to another embodiment of the present invention.

FIG. 6 is a cross-sectional view of an OLED according to another embodiment of the present invention.

Referring to FIG. 6, the OLED according to the current embodiment is different from the OLED according to the embodiment of FIG. 1 in that it further includes a second TFT.

In an example embodiment, the OLED may include the second TFT. The second TFT may include a second semiconductor layer 41, a second gate electrode 26, a second source electrode 65, and a second drain electrode 66.

In an example embodiment, the second drain electrode 66 may be electrically coupled to a first contact. Accordingly, a photodiode 50 and the second drain electrode 66 may be electrically coupled to each other.

In another example embodiment, the second drain electrode 66 may be formed integrally with the first contact.

A second contact 64 may be located opposite the first contact and electrically coupled to the photodiode 50 as described above.

The photodiode 50 may generate a current when irradiated with light, and the generated current may be delivered (or provided) to the second TFT. The second TFT may be coupled to a sensing line. The second TFT may be driven according to the intensity of light irradiated to (or on) the photodiode 50, and the intensity of light generated from an organic layer 150 may be adjusted based on the driving of the second TFT.

FIGS. 7 through 16 are views illustrating a method of manufacturing an OLED according to an embodiment of the present invention.

Referring to FIGS. 7 through 16, the method of manufacturing an OLED according to the current embodiment includes placing a photodiode on a substrate, forming a planarization layer to cover the photodiode, placing a first electrode on the planarization layer, forming a pixel defining layer to at least partially expose the first electrode, placing an organic layer on the first electrode exposed by the pixel defining layer, and forming a second electrode to cover the pixel defining layer and the organic layer. The placing of the first electrode on the planarization layer includes forming a first region which overlaps the photodiode and a second region which is a region that excludes the first region to have different thicknesses.

The method of manufacturing an OLED according to the current embodiment will now be described in more detail with reference to the drawings.

Figure 7:
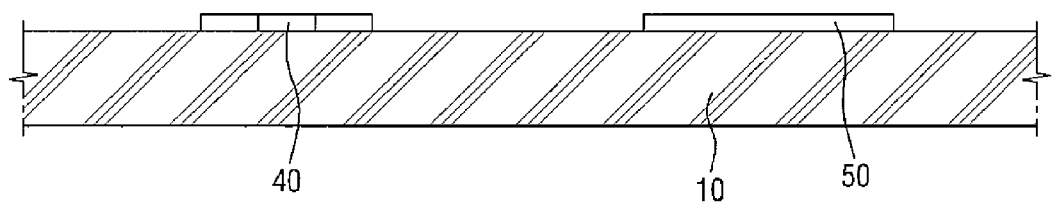
FIGS. 7 through 16 are views illustrating a method of manufacturing an OLED according to an embodiment of the present invention.

Referring to FIG. 7, a semiconductor layer 40 and a photodiode 50 may be formed on a substrate 10. As described above, the semiconductor layer 40 and the photodiode 50 may be placed at the same level. In addition, the semiconductor layer 40 and the photodiode 50 may be formed of substantially the same material. Since this has been described above in detail, this description thereof will be omitted.

Figure 8:
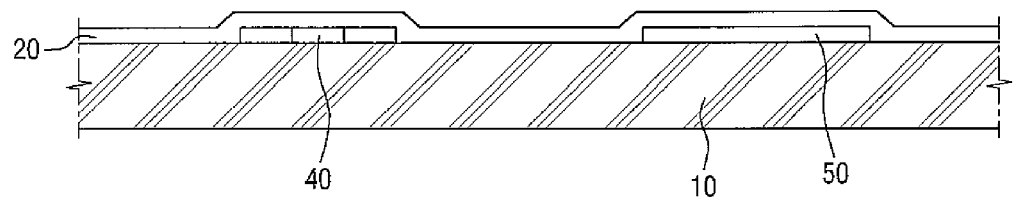

Referring to FIG. 8, a gate insulating layer 20 may be placed on the semiconductor layer 40 and the photodiode 50. The gate insulating layer 20 can be formed using, for example, any method that is known by those skilled in the art, such as deposition, sputtering or printing.

Figure 9:
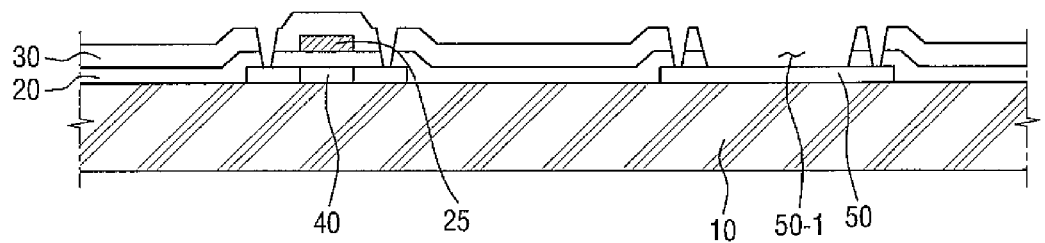

Referring to FIG. 9, a gate electrode 25 may be formed on the gate insulating layer 20, and an interlayer insulating film 30 may be formed on the gate electrode 25. After the forming of the interlayer insulating film 30, via holes in which a source electrode 61, a drain electrode 62, a first contact 63 and a second contact 64 can be placed may be formed. At this stage, a top surface of the photodiode 50 may also be exposed. That is, the forming of the via holes in which the source electrode 61, the drain electrode 62, the first contact 63 and the second contact 64 can be placed may include forming an exposed portion 50-1 which exposes the photodiode 50.

Figure 10:
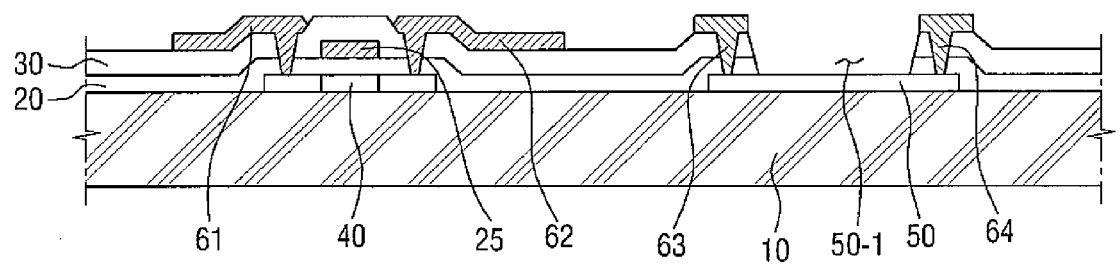

Referring to FIG. 10, the source electrode 61, the drain electrode 62, the first contact 63 and the second contact 64 may be formed. The source electrode 61, the drain electrode 62, the first contact 63 and the second contact 64 may be formed substantially simultaneously and made of substantially the same material as described above.

Figure 11:
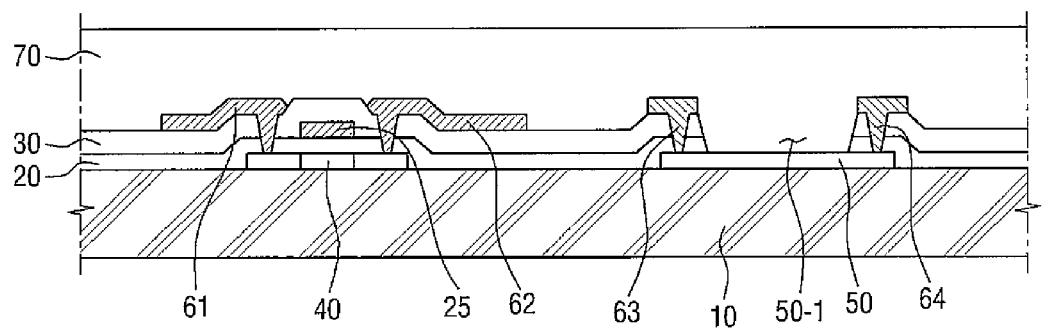

Referring to FIG. 11, a planarization layer 70 may be formed to cover the photodiode 50. The planarization layer 70 can be formed using, for example, any method known by those skilled in the art. For example, the planarization layer 70 may be formed by photoresist processing. However, this is merely an example, and the method of forming the planarization layer 70 is not limited to this example.

Figure 12:
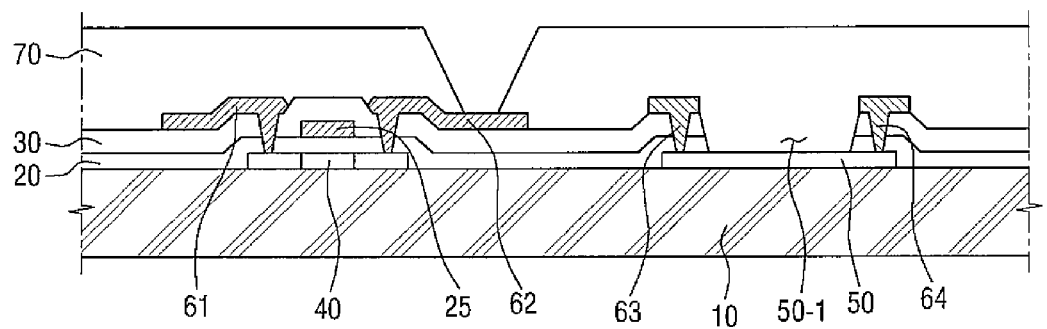

Referring to FIG. 12, a first via hole 71 may be formed in the planarization layer 70. The first via hole 71 may at least partially expose the drain electrode 62.

Figure 13:
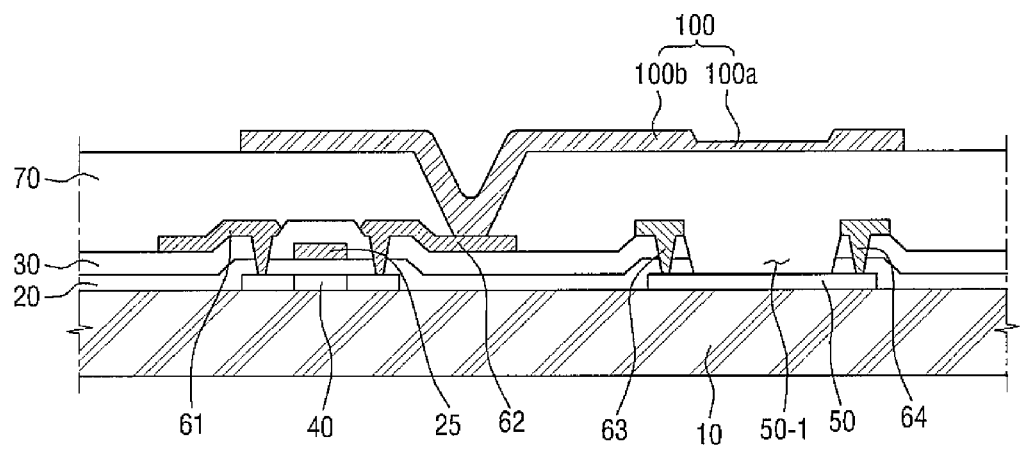

Referring to FIG. 13, a first electrode 100 may be placed on the planarization layer 70. The placing of the first electrode 100 may include forming a first region 100a which overlaps the photodiode 50 to have a different thickness from a second region 100b which excludes the first region 100a. Specifically, the placing of the first electrode 100 may include forming the first region 100a to be thinner than the second region 100b.

Figure 14:
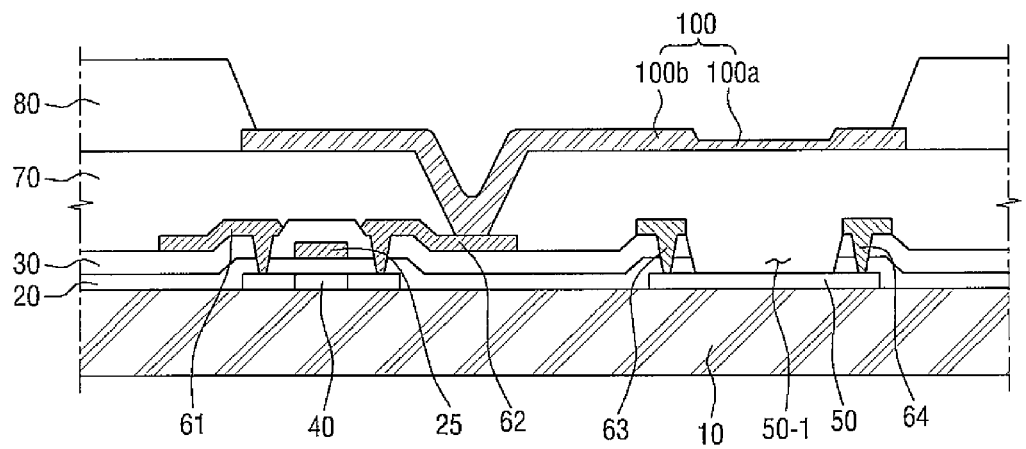

Referring to FIG. 14, a pixel defining layer 80 may be formed to at least partially expose the first electrode 100. The pixel defining layer 80 may be placed on both sides of the first electrode 100 and expose a central portion of the first electrode 100.

Figure 15:
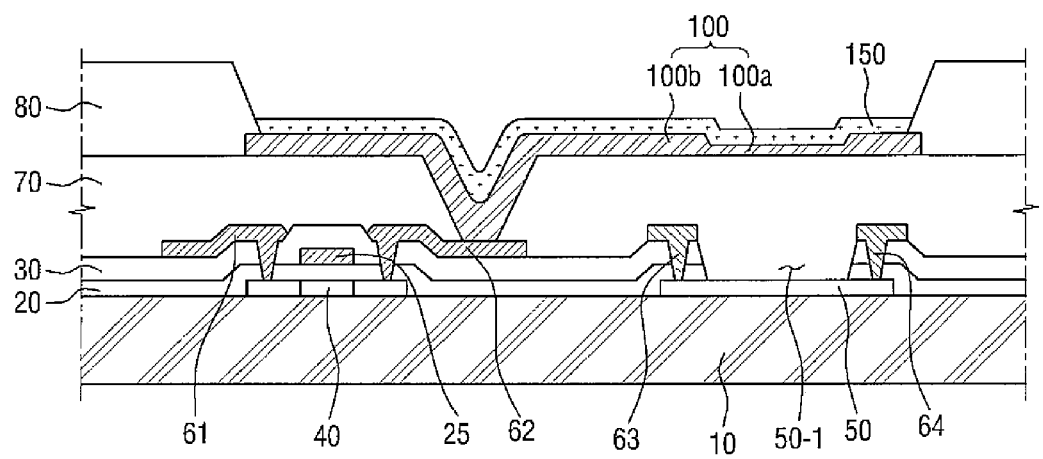

Referring to FIG. 15, an organic layer 150 may be formed to cover the first electrode 100 that is exposed by the pixel defining layer 80. The organic layer 150 may cover the first electrode 100 in a space defined by the pixel defining layer 80.

Figure 16:
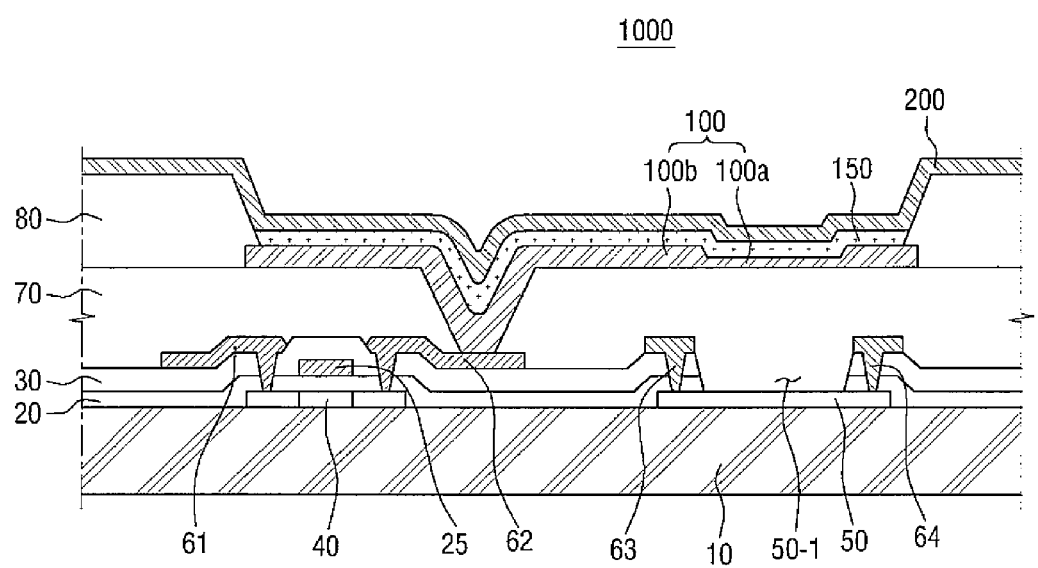

Referring to FIG. 16, a second electrode 200 may be formed to cover the pixel defining layer 80 and the organic layer 150. As described above, the second electrode 200 may be a whole-surface electrode which completely covers the pixel defining layer 80 and the organic layer 150.

A method of manufacturing an OLED according to another embodiment of the present invention will now be described with reference to FIGS. 17 through 19.

Figure 17:
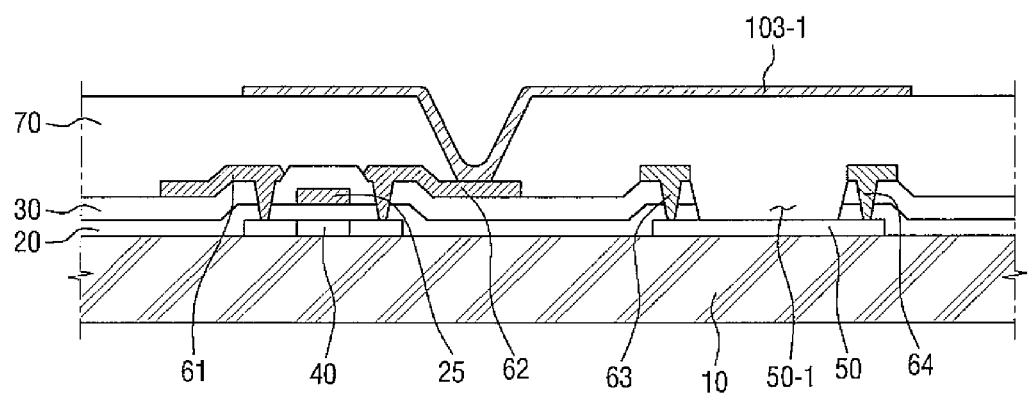
FIGS. 17 through 19 are views illustrating a method of manufacturing an OLED according to another embodiment of the present invention.
Figure 18:
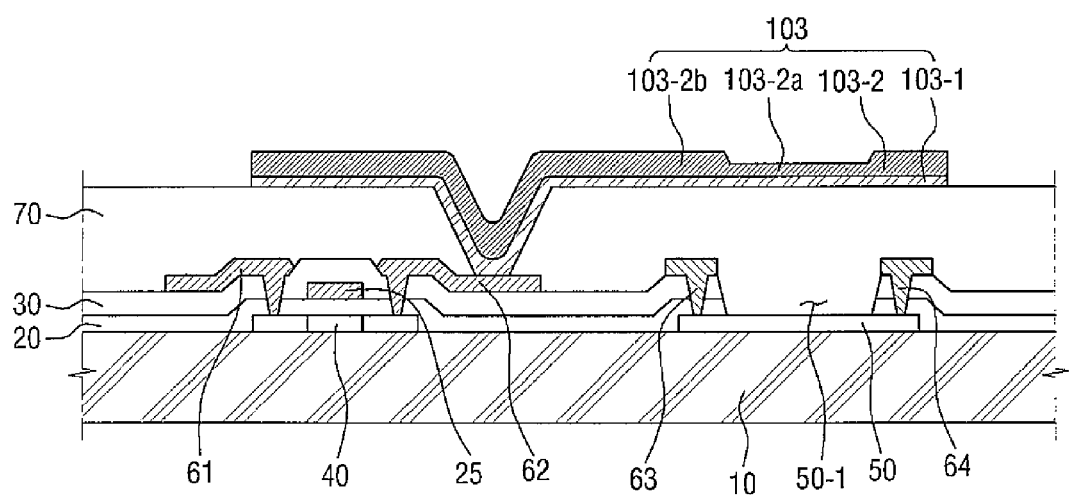
Figure 19:
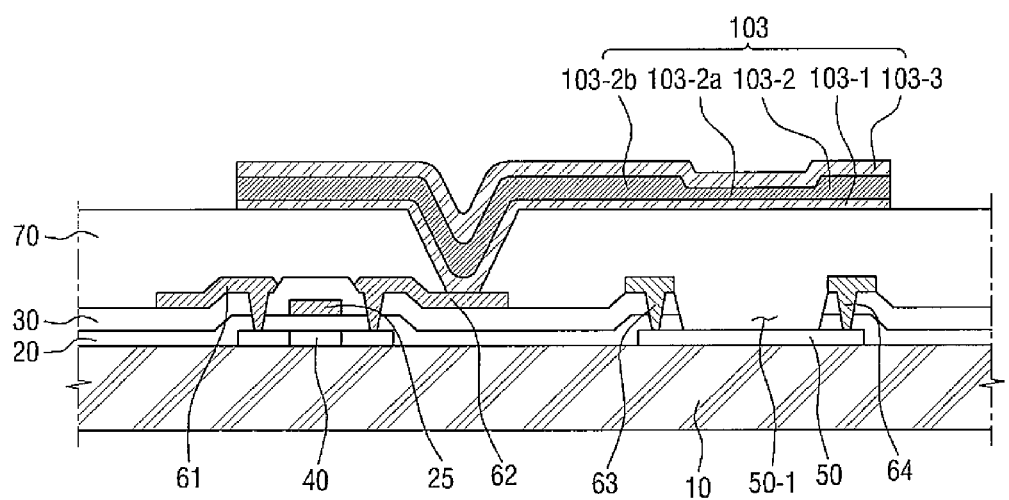

FIGS. 17 through 19 are views illustrating a method of manufacturing an OLED according to another embodiment of the present invention.

In the method of manufacturing an OLED according to the current embodiment, a first electrode 100 may be placed on a planarization layer 70. The placing of the first electrode 100 on the planarization layer 70 may include forming a first layer first electrode 103-1 on the planarization layer 70 (see FIG. 17), forming a second layer first electrode 103-2 on the first layer first electrode 103-1 (see FIG. 18), and forming a third layer first electrode 103-3 on the second layer first electrode 103-2 (see FIG. 19). The first layer first electrode 103-1, the second layer first electrode 103-2 and the third layer first electrode 103-3 may be substantially the same as those included in the OLED according to the embodiment of FIG. 5.

As described in the embodiment above, the second layer first electrode 103-2 may be a reflective electrode containing, for example, Ag, and each of the first layer first electrode 103-1 and the third layer first electrode 103-3 may be a transparent electrode. In addition, each of the first layer first electrode 103-1 and the third layer first electrode 103-3 may have a uniform thickness, and the second layer first electrode 103-2 may include a first region 103-2a and a second region 103-2b having different thicknesses. For example, the first region 103-2a may be thinner than the second region 103-2b.

Embodiments of the present invention may have at least one of the following features.

For example, it is possible to enhance the sensing capability of an optical sensor by suppressing the interference of external light.

In addition, light generated from an organic layer can reach the optical sensor in an increased amount.

However, the effects of the present invention are not restricted to the embodiments set forth herein. The above and other effects of the present invention will become more apparent to one having ordinary skill in the art to which the present invention pertains by referencing the claims. While this invention has been described in connection with what is presently considered to be practical example embodiments, it is to be understood that the invention is not limited to the disclosed embodiments, but, to the contrary, is intended to cover various modifications and equivalent arrangements included within the spirit and scope of the appended claims, and their equivalents.

What is claimed is:

1. An organic light-emitting display comprising:
   a substrate;
   a photodiode on the substrate;
   a planarization layer covering the photodiode;
   a first electrode on the planarization layer;
   a pixel defining layer at least partially exposing the first electrode;
   an organic layer covering the first electrode exposed by the pixel defining layer; and
   a second electrode covering the pixel defining layer and the organic layer,
   wherein the first electrode comprises a first region overlapping the photodiode and a second region which is a remaining region of the first electrode excluding the first region, and
   wherein a thickness of the first region of the first electrode is different from a thickness of the second region of the first electrode.

2. The organic light-emitting display of claim 1, wherein the first region is thinner than the second region.

3. The organic light-emitting display of claim 1, wherein the first electrode comprises a reflective electrode.

4. The organic light-emitting display of claim 3, wherein the first electrode comprises silver (Ag).

5. The organic light-emitting display of claim 1, further comprising:
   a gate insulating layer covering the photodiode; and
   an interlayer insulating film covering the gate insulating layer,
   wherein the photodiode comprises a portion exposed by the gate insulating layer and the interlayer insulating film, and
   wherein the first region overlaps the exposed portion.

6. The organic light-emitting display of claim 5, wherein a width of the first region is equal to or greater than a width of the exposed portion.

7. The organic light-emitting display of claim 1,
   wherein the first electrode comprises a first layer first electrode on the planarization layer and a second layer first electrode on the first layer first electrode,
   wherein the first layer first electrode has a uniform thickness, and the first region of the second layer first electrode is thinner than the second region of the second layer first electrode.

8. The organic light-emitting display of claim 1,
   wherein the first electrode comprises a first layer first electrode on the planarization layer, a second layer first electrode on the first layer first electrode, and a third layer first electrode on the second layer first electrode.

9. The organic light-emitting display of claim 8,
   wherein each of the first layer first electrode and the third layer first electrode has a uniform thickness, and
   wherein the first region of the second layer first electrode is thinner than the second region of the second layer first electrode.

10. The organic light-emitting display of claim 9,
    wherein each of the first layer first electrode and the third layer first electrode comprises a transparent electrode, and
    wherein the second layer first electrode comprises a reflective electrode.

11. The organic light-emitting display of claim 10, wherein the second layer first electrode comprises Ag.

12. A method of manufacturing an organic light-emitting display, the method comprising:
- placing a photodiode on a substrate;
- forming a planarization layer to cover the photodiode;
- placing a first electrode on the planarization layer;
- forming a pixel defining layer and at least partially exposing the first electrode;
- placing an organic layer on the first electrode exposed by the pixel defining layer; and
- forming a second electrode to cover the pixel defining layer and the organic layer,
- wherein the placing the first electrode on the planarization layer comprises forming a first region of the first electrode overlapping the photodiode, and forming a second region of the first electrode having a different thickness than the first region, the second region being a remaining region of the first electrode excluding the first region.

13. The method of claim 12, wherein the forming the first region of the first electrode comprises forming the first region to be thinner than the second region.

14. The method of claim 12, wherein the placing the first electrode on the planarization layer comprises:
- forming a first layer first electrode having a uniform thickness on the planarization layer;
- forming a second layer first electrode on the first layer first electrode; and
- forming a third layer first electrode on the second layer first electrode.

15. The method of claim 14,
- wherein each of the first layer first electrode and the third layer first electrode comprises a transparent electrode, and
- wherein the second layer first electrode comprises a reflective electrode.

16. The method of claim 15, wherein the second layer first electrode comprises Ag.

17. The method of claim 14,
- wherein each of the first layer first electrode and the third layer first electrode has a uniform thickness, and
- wherein the first region of the second layer first electrode is thinner than the second region of the second layer first electrode.

* * * * *